(12) United States Patent
Uchida et al.

(10) Patent No.: US 11,823,929 B2
(45) Date of Patent: *Nov. 21, 2023

(54) SUBSTRATE TREATING APPARATUS

(71) Applicant: SCREEN Holdings Co., Ltd., Kyoto (JP)

(72) Inventors: Yuzo Uchida, Kyoto (JP); Noriyuki Kikumoto, Kyoto (JP); Hiroyuki Kawahara, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

This patent is subject to a terminal disclaimer.

(21) Appl. No.: 18/162,050

(22) Filed: Jan. 31, 2023

(65) Prior Publication Data

US 2023/0187245 A1  Jun. 15, 2023

Related U.S. Application Data

(63) Continuation of application No. 17/022,165, filed on Sep. 16, 2020, now Pat. No. 11,594,436.

(30) Foreign Application Priority Data

Sep. 27, 2019 (JP) .................................. 2019-176996

(51) Int. Cl.
| | | |
|---|---|---|
| *H01L 21/67* | (2006.01) | |
| *H01L 21/673* | (2006.01) | |
| *B08B 3/04* | (2006.01) | |
| *H01L 21/687* | (2006.01) | |
| *H01L 21/677* | (2006.01) | |

(52) U.S. Cl.
CPC .......... *H01L 21/6732* (2013.01); *B08B 3/041* (2013.01); *H01L 21/67051* (2013.01); *H01L 21/67742* (2013.01); *H01L 21/68707* (2013.01)

(58) Field of Classification Search
CPC .................................................. H01L 21/6732
See application file for complete search history.

(56) References Cited

U.S. PATENT DOCUMENTS

| | | | |
|---|---|---|---|
| 10,040,102 B2 | 8/2018 | Mitsuyoshi et al. | ......... 134/25.1 |
| 10,195,743 B2 | 2/2019 | Kitahara et al. | |
| 10,910,240 B2 | 2/2021 | Muramoto | |
| 2008/0156351 A1 | 7/2008 | Mitsuyoshi et al. | ............ 134/15 |
| 2008/0156361 A1 | 7/2008 | Mitsuyoshi | ................... 134/157 |

(Continued)

FOREIGN PATENT DOCUMENTS

| | | |
|---|---|---|
| CN | 101211758 A | 7/2008 |
| CN | 101211757 B | 2/2012 |

(Continued)

OTHER PUBLICATIONS

Office Action dated Jun. 9, 2021 for corresponding Taiwan Patent Application No. 109129421.

(Continued)

*Primary Examiner* — Jason Y Ko
(74) *Attorney, Agent, or Firm* — Ostrolenk Faber LLP

(57) ABSTRACT

Disclosed is a substrate treating apparatus for performing a cleaning treatment on substrates. The apparatus includes an indexer block with an indexer robot, a treating block including a cleaning unit, and a path block disposed between the indexer block and the treating block. The indexer robot includes a guide rail, a base, an articulated arm, and a hand. The guide rail is positioned so as not to overlap a mount position of a substrate in the path block.

20 Claims, 12 Drawing Sheets

(56) References Cited

U.S. PATENT DOCUMENTS

| | | | |
|---|---|---|---|
| 2008/0199284 A1 | 8/2008 | Mitsuyoshi et al. | 414/223.02 |
| 2009/0165950 A1 | 7/2009 | Kim et al. | 156/345.1 |
| 2013/0333731 A1 | 12/2013 | Kato | 134/32 |
| 2015/0131088 A1 | 5/2015 | Shinohara et al. | |

FOREIGN PATENT DOCUMENTS

| | | |
|---|---|---|
| CN | 101471237 B | 2/2012 |
| CN | 105378908 A | 3/2016 |
| JP | 2008-166369 A | 7/2008 |
| JP | 2014-3080 A | 1/2014 |
| JP | 2014-3139 A | 1/2014 |
| JP | 2017-127956 A | 7/2017 |
| KR | 10-2008-0076787 A | 8/2008 |
| KR | 10-2010-0025313 A | 3/2010 |
| KR | 10-2018-0108737 A | 10/2018 |
| KR | 10-2019-0046808 A | 5/2019 |
| TW | 201538290 A | 10/2015 |

OTHER PUBLICATIONS

Office Action dated Apr. 20, 2022 for corresponding Korean Patent Application No. 10-2020-0123001.
Office Action dated Apr. 27, 2022 for corresponding Chinese Patent Application No. 202011019558.6.
Notice of Allowance dated Aug. 10, 2022 for corresponding Korean Patent Application No. 10-2020-0123001.
Office Action dated Mar. 8, 2023 for corresponding Taiwanese Patent Application No. 109129421.
Office Action dated May 30, 2023 for corresponding Japanese Patent Application No. 2019-176996.

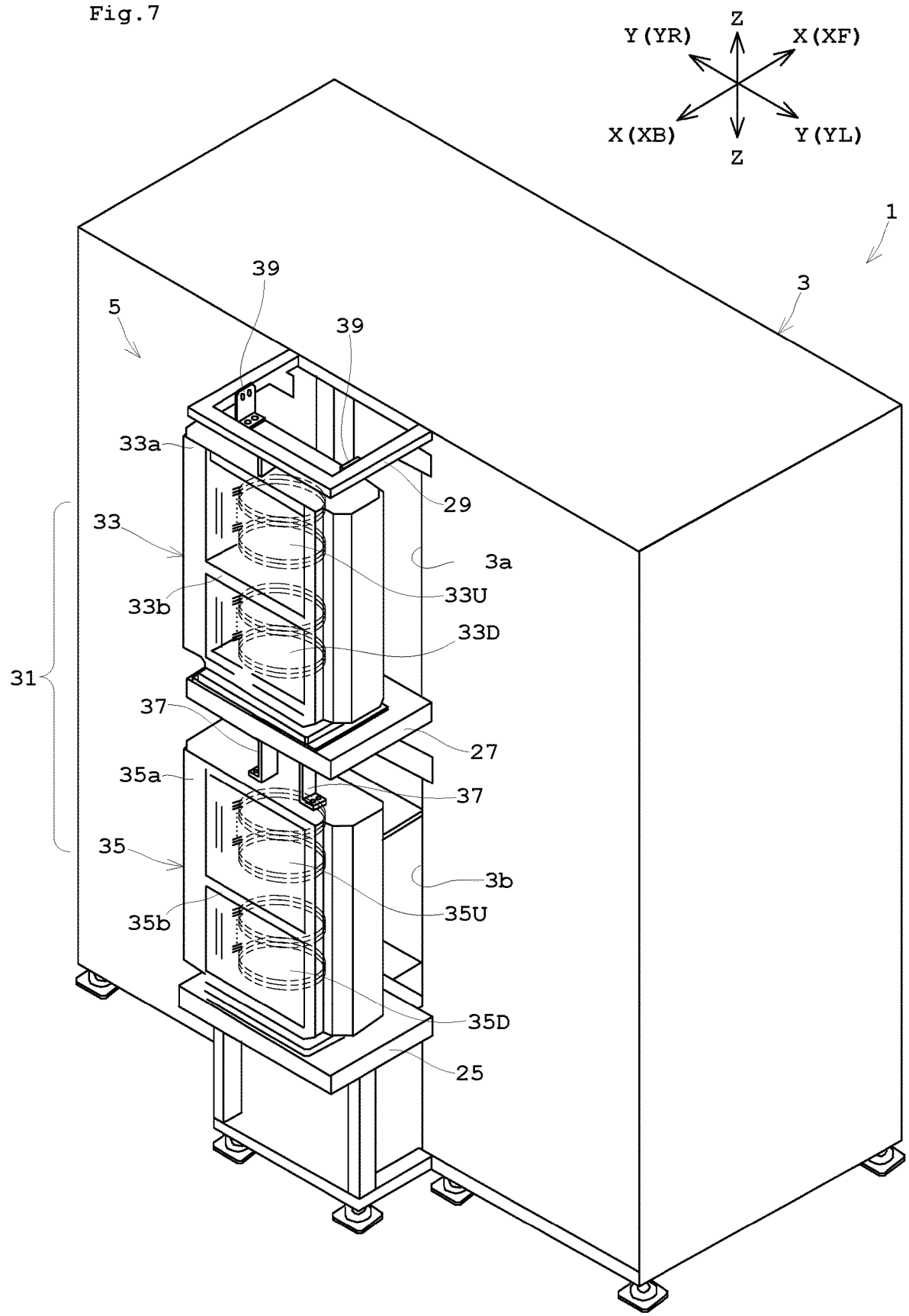

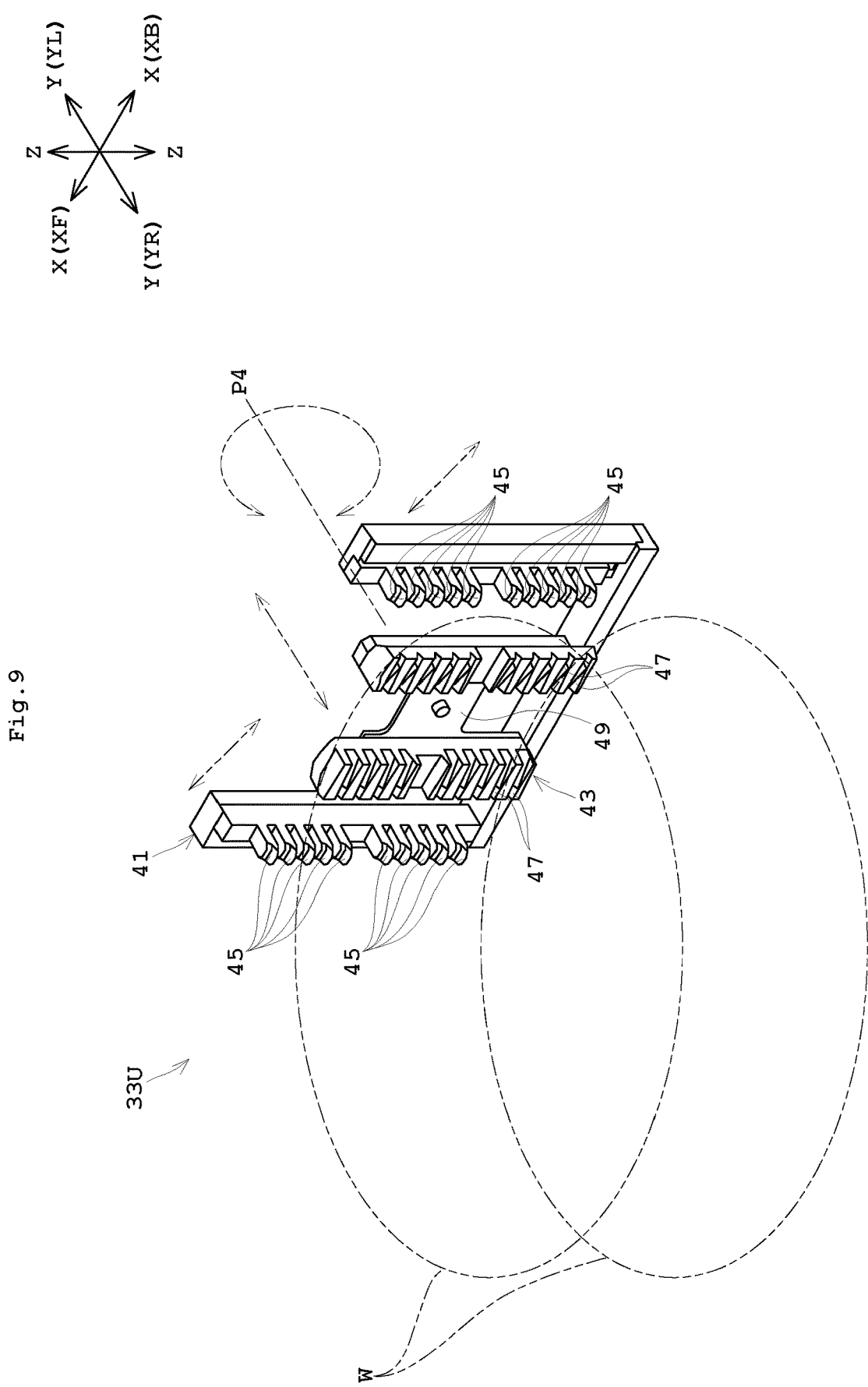

SUBSTRATE TREATING APPARATUS

CROSS-REFERENCE TO RELATED APPLICATION(S)

The present application is a continuation of U.S. patent application Ser. No. 17/022,165, filed Sep. 16, 2020, which claims priority to Japanese Patent Application No. JP 2019-176996, filed Sep. 27, 2019, the contents of all of which are incorporated herein by reference.

BACKGROUND OF THE INVENTION

Field of the Invention

The present invention relates to a substrate treating apparatus for performing treatment with a treatment liquid on a substrate, such as a semiconductor wafer, a substrate for a liquid crystal display or for an organic electroluminescence (EL) display, a glass substrate for photomask, an optical disk substrate, a magnetic disk substrate, a ceramic substrate, a substrate for a solar cell, or the like (hereinafter, simply referred to as substrate).

Background Art

Examples of currently-used devices of this type includes one including an indexer block, a treating block, and a reversing path block. See, for example, Japanese Unexamined Patent Application Publication No. 2008-166369 (FIG. 1). The treating block includes a front face cleaning unit and a rear face cleaning unit. The reversing path block is attached between an indexer block and a treating block.

The indexer block includes carrier platforms and an indexer robot. Carriers are placed on the carrier platforms, respectively, in which a plurality of substrates are accommodated. The indexer robot transports the substrates individually between the carriers and the reversing path block. The reversing path block includes a plurality of shelves where the substrates are placed. The reversing path block includes a reversing path unit configured to deliver the substrates to and from the treating block. Moreover, the reversing path unit reverses faces of each of the substrates. The treating block includes a main robot. The main robot transports substrates among the front face cleaning units, the rear face cleaning units, and the reversing path unit.

The indexer robot is configured to be movable in a horizontal direction along which carrier platforms are arranged. Moreover, the indexer robot is configured to be extendible and contractible in an up-down direction and to be rotatable around a vertical axis. A hand installed on an upper part of the indexer robot can advance/retreat in the horizontal direction. The indexer robot configured as above moves horizontally to a position facing the reversing path unit during treatment of a substrate while the substrate taken from a carrier is held with the hand. Thereafter, the indexer robot moves the hand vertically to a shelf where the substrate is to be delivered in the reversing path unit, and then advances the hand to the shelf. Thereafter, the indexer robot moves the hand downward, thereby transporting the substrate to the reversing path unit. Moreover, when receiving the substrate treated in the treating block, the indexer robot moves horizontally to a position facing the reversing path unit. Thereafter, the indexer robot moves the hand vertically to a shelf where the cleaned substrate is placed in the reversing path unit, and then advances the hand to the shelf. Thereafter, the indexer robot moves the hand upward, thereby receiving the substrate from the reversing path unit.

SUMMARY OF THE INVENTION

However, the conventional example with such a configuration as above possesses the following drawback.

That is, in the currently-used apparatus, the indexer robot has to move horizontally to a position facing the reversing path unit. Accordingly, it needs time to deliver the substrate to and from the reversing path block, leading to a problem that transportation efficiency is reduced.

In order to solve this problem, it is conceivable that an indexer robot including a guide rail, a base, and an articulated arm is employed. The guide rail is positioned in a horizontally fixed manner, and extends along the up-down direction. The base moves along the guide rail in the up-down direction. The articulated arm includes a hand on its distal end. The articulated arm is installed on the base. The base of the indexer robot described above is disposed at a center portion in the horizontal direction along which a plurality of carrier platforms is arranged. Moreover, the indexer robot described above places the base at an adjacent position to a position facing a mount position of the substrate in the reversing path block. Here, the adjacent position is a position suitable for delivering the substrates to and from the reversing path block. This enables the indexer robot to deliver the substrates to and from the carriers of the carrier platforms. On the other hand, such arrangement leads to another problem that the guide rail prevents delivering of the substrates to and from the reversing path unit.

The present invention has been made regarding the state of the art noted above, and its one object is to provide a substrate treating apparatus that allows enhanced deliver efficiency of substrates to and from a reversing path block by devising arrangement of an indexer robot.

Solution to Problem

The present invention is constituted as stated below to achieve the above object.

One aspect of the present invention provides a substrate treating apparatus that performs a cleaning treatment on a substrate. The apparatus includes an indexer block including a carrier platform on which a carrier capable of accommodating a plurality of substrates is placed, and an indexer robot configured to transport a substrate to and from the carrier disposed on the carrier platform, a treating block including a front face cleaning unit and a back face cleaning unit as treating units, the front face cleaning unit configured to perform a front face cleaning treatment on a substrate and the back face cleaning unit configured to perform a back face cleaning treatment on a substrate, and a reversing path block disposed between the indexer block and the treating block, including a plurality of shelves on which the substrates are placed, and having a reversing function of reversing faces of the substrates. The indexer robot includes a guide rail erected in a fixed manner in a horizontal direction, a base configured to move vertically along the guide rail, an articulated arm disposed on the base, and a hand configured to support a substrate on a distal arm of the articulated arm. The guide rail is positioned so as not to overlap a mount position of the substrate in the reversing path block when seen from the carrier platform.

According to the aspect of the present invention, the indexer robot is disposed such that the guide rail is positioned so as not to overlap the mount position of the substrate in the reversing path block when seen from the carrier platform. Accordingly, even when the base is disposed adjacent to a position facing the mount position of the substrate suitable for delivering the substrate, the guide rail does not prevent delivering of the substrate between the hand of the indexer robot and the reversing path block. This results in enhanced deliver efficiency of the substrate between the indexer robot and the reversing path block.

It is preferred in the aspect of the present invention that the guide rail is shifted laterally from a virtual line connecting the center of the mount position and the center of the indexer block in plan view.

Accordingly, the guide rail does not prevent delivering of the substrate between the hand of the indexer robot and the reversing path block.

It is preferred in the aspect of the present invention that the indexer block includes a plurality of the carrier platforms in the horizontal direction, the base includes a base body, and a fixing arm extending from the base body toward the carrier platforms, the indexer robot further includes a proximal end of the articulated arm adjacent to a distal end of the fixing arm, and the distal end of the fixing arm is disposed at a center portion in the horizontal direction along which the carrier platforms are arranged.

The distal end of the fixing arm is disposed at the center portion. Accordingly, even when the guide rail is positioned so as not to overlap the mount position of the substrate in the reversing path block when seen from the carrier platform, the hand of the articulated arm can deliver substrates to and from the carriers of the carrier platforms.

It is preferred in the aspect of the present invention that the guide rail is positioned adjacent to an inner wall of the indexer block adjacent to the reversing path block.

A distance between a carrier platform and the reversing path block in the indexer block can be shortened. Consequently, a reduction in size of the substrate treating apparatus is obtainable.

It is preferred in the aspect of the present invention that a rotary shaft in a first joint of the articulated arm is shifted from the guide rail toward the mount position when seen from the carrier platforms.

The hand of the articulated arm on the distal end can easily deliver a substrate at the mount position of the substrate in the reversing path block.

BRIEF DESCRIPTION OF THE DRAWINGS

For the purpose of illustrating the invention, there are shown in the drawings several forms which are presently preferred, it being understood, however, that the invention is not limited to the precise arrangement and instrumentalities shown.

FIG. 6A illustrates four hand bodies, and FIG. 6B illustrates two hand bodies.

FIG. 7 is a perspective view of a reversing path block when the indexer block is seen from a rear face thereof.

FIG. 9 is a perspective view of a principal part of a reversing path unit.

DESCRIPTION OF EMBODIMENTS

The following describes one embodiment of the present invention with reference to the drawings.

Figure 1:
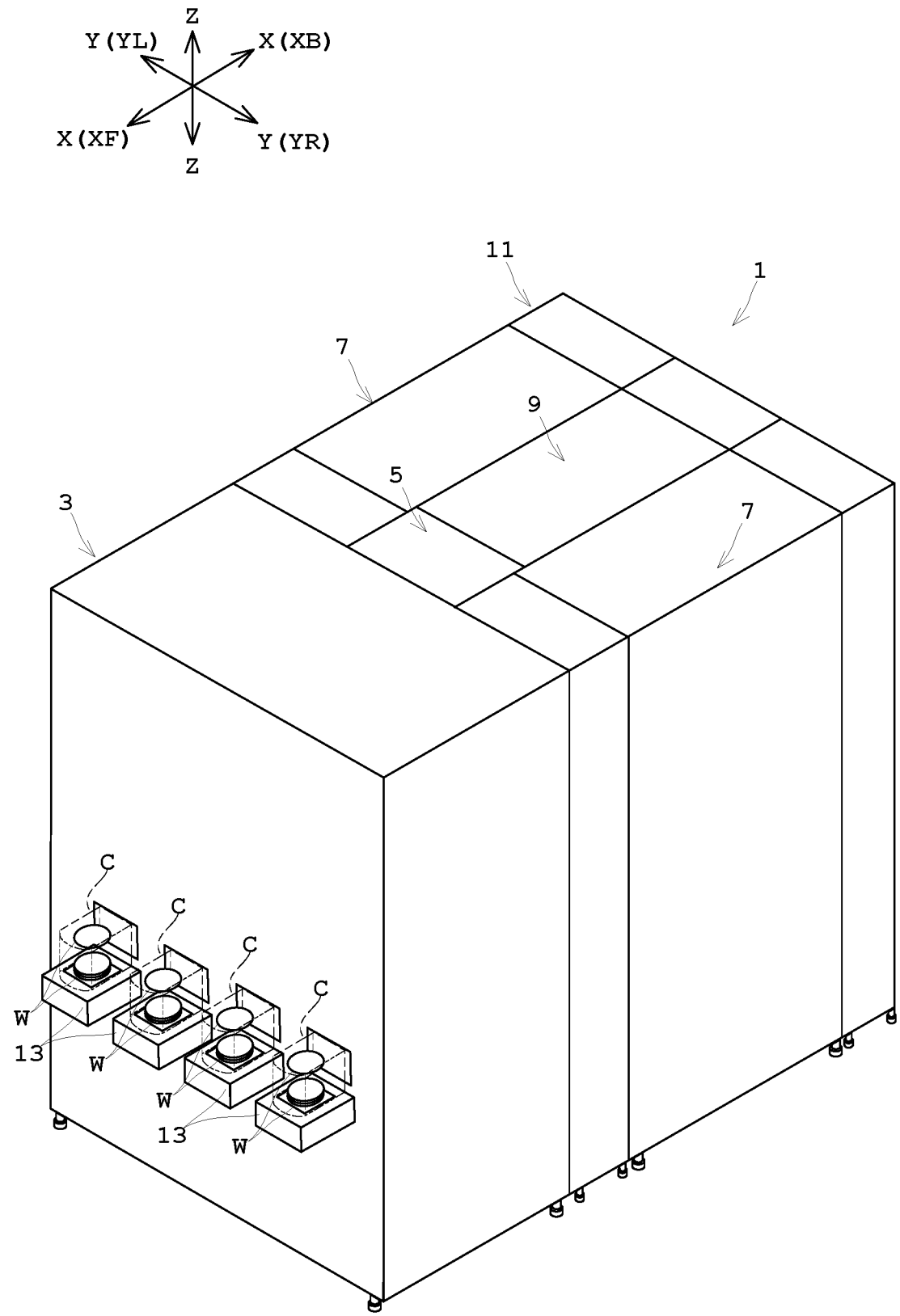
FIG. 1 is a perspective view of an overall configuration of a substrate treating apparatus according to one embodiment of the present invention.
Figure 2:
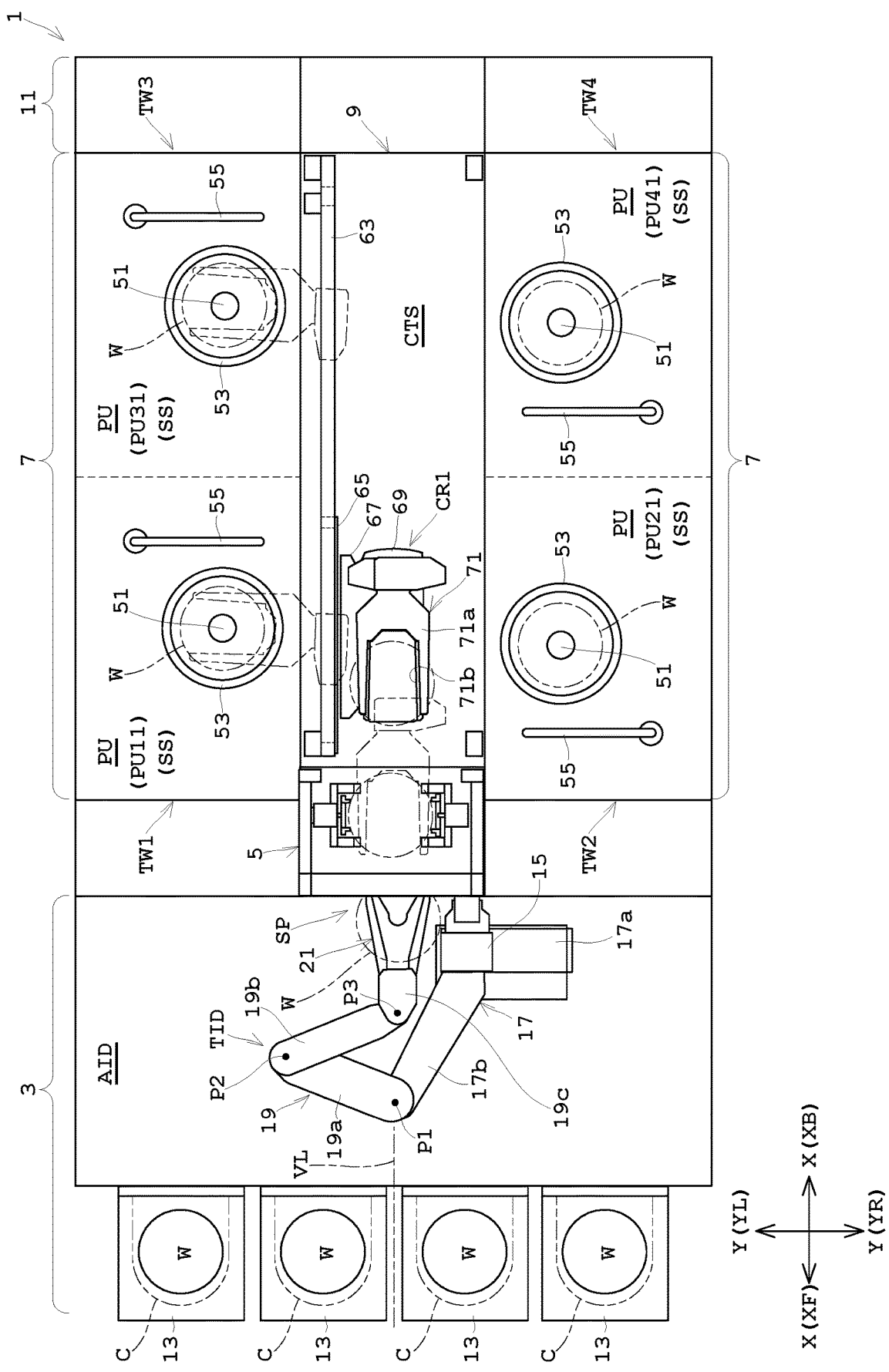
FIG. 2 is a plan view of the substrate treating apparatus illustrating an upper layer of an upper stage of a treating block.
Figure 3:
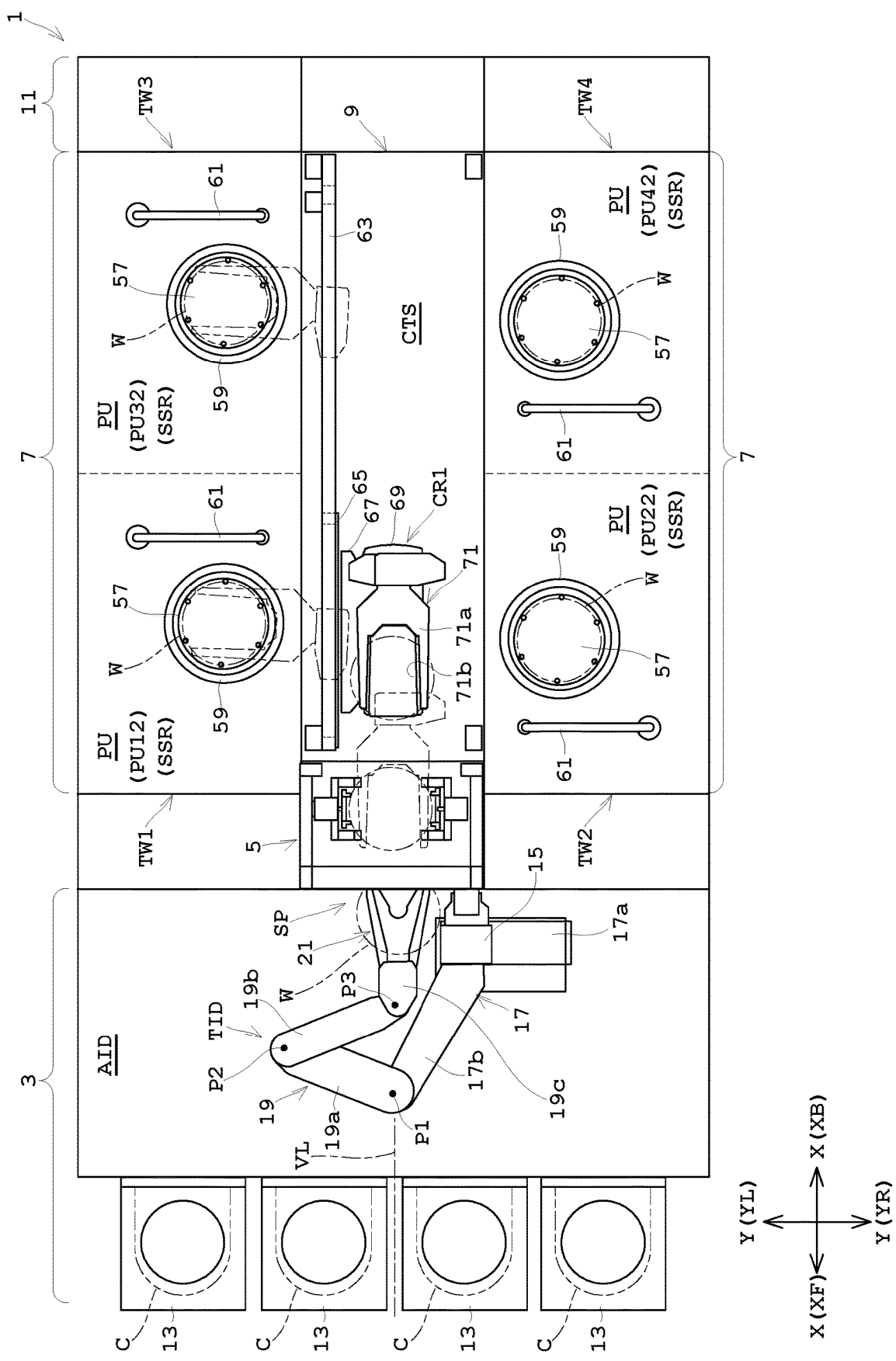
FIG. 3 is a plan view of the substrate treating apparatus illustrating a lower layer of the upper stage of the treating block.
Figure 4:
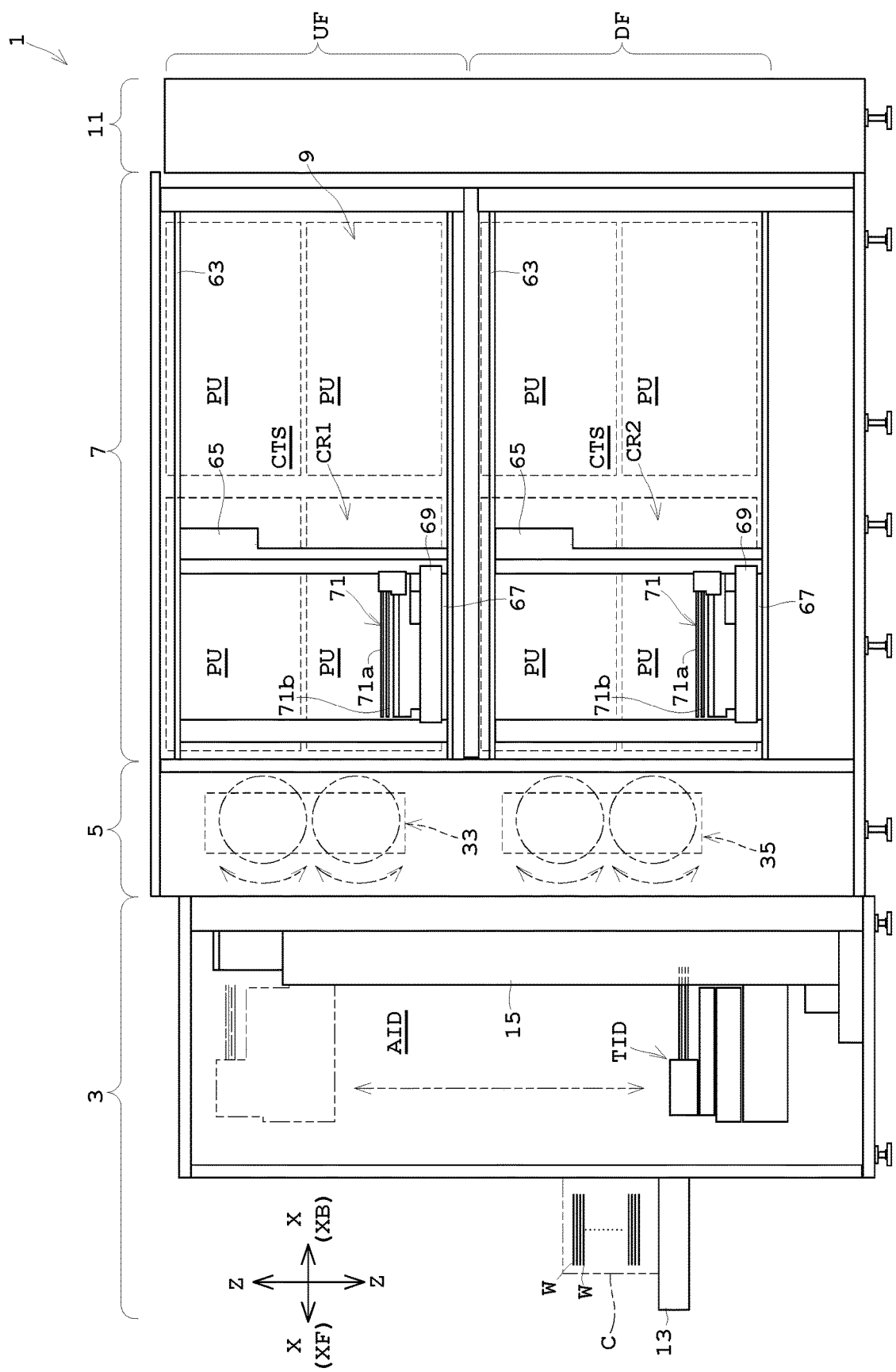
FIG. 4 is a side view of the substrate treating apparatus.

FIG. 1 is a perspective view of an overall configuration of a substrate treating apparatus according to one embodiment of the present invention. FIG. 2 is a plan view of the substrate treating apparatus illustrating an upper layer of an upper stage of a treating block. FIG. 3 is a plan view of the substrate treating apparatus illustrating a lower layer of the upper stage of the treating block. FIG. 4 is a side view of the substrate treating apparatus.

A substrate treating apparatus 1 according to one embodiment of the present invention enables a front face cleaning treatment and a back face cleaning treatment. The front face cleaning treatment is a treatment of cleaning a front face of the substrate W. The back face cleaning treatment is a treatment of cleaning a back face of the substrate W. The substrate treating apparatus 1 includes an indexer block 3, a reversing path block 5, treating blocks 7, a transportation block 9, and a utility block 11.

The indexer block 3 delivers the substrate W, as a treatment target, to and from the reversing path block 5. The reversing path block 5 is disposed between the indexer block 3 and the treating blocks 7. The reversing path block 5 delivers the substrate W directly to and from the indexer block 3 and the transportation block 9 without reversing the substrate W. Moreover, the reversing path block 5 delivers the substrate W to and from the transportation block 9 while reversing the substrate W. The transportation block 9 transports the substrate W between the reversing path block 5 and the treating block 7. The treating block 7 includes front face cleaning units SS and back face cleaning units SSR. The front face cleaning units SS each clean the front face of the substrate W. The back face cleaning units SSR each clean a back face of the substrate W. The utility block 11 includes a treatment liquid such as a chemical or deionized water, and gas such as a nitrogen gas or air to be supplied to the treating block 7.

The substrate treating apparatus 1 is configured such that the indexer block 3, the reversing path block 5, the treating blocks 7 and the transportation block 9, and the utility block 11 are arranged in this order.

In the following description, a direction where the indexer block 3, the reversing path block 5, the treating blocks 7 and the transportation block 9, and the utility block 11 are arranged is referred to as a "front-back direction X" (horizontal direction). Specifically, a direction from the utility block 11 to the indexer block 3 is referred to as "forward XF", whereas a direction opposite to the forward direction XF is referred to as "backward XB". A direction orthogonal with respect to the front-back direction X is referred to as "width Y". Moreover, one side of the "width direction Y" is appropriately referred to as "right YR", whereas a side opposite to the "right direction YR" is referred to as "left YL" when seen from a front side of the indexer block 3. Moreover, a vertical direction is referred to as an "up-down direction Z" (a height direction, a vertical direction). It should be noted that simple description such as "lateral" and "transverse" is not limited to any of the front-back direction X and the width direction Y.

The indexer block 3 includes carrier platforms 13, a transportation space AID, and an indexer robot TID. The substrate treating apparatus 1 of this embodiment includes four carrier platforms 13, for example. Specifically, four carrier platforms 13 are provided in the width direction Y. Carriers C are placed on the carrier platforms 13 individually. The carriers C each accommodate a plurality of (e.g., 25) substrates W in a stacked manner. The carrier platforms 13 deliver the carriers C individually to and from an overhead hoist transport (OHT) (also referred to as overhead travelling unmanned guided vehicle), not shown, for example. The OHT transports the carriers C with use of a ceiling of a clean room. Examples of the carriers C include a front opening unified pod (FOUP).

The transportation space AID is disposed in the backward direction XB of the carrier platforms 13. The transportation space AID includes the indexer robot TID provided therein. The indexer robot TID delivers the substrate W to and from the carriers C. Moreover, the indexer robot TID delivers the substrate W to and from the reversing path block 5. The transportation space AID includes only one indexer robot TID provided therein.

Figure 5:
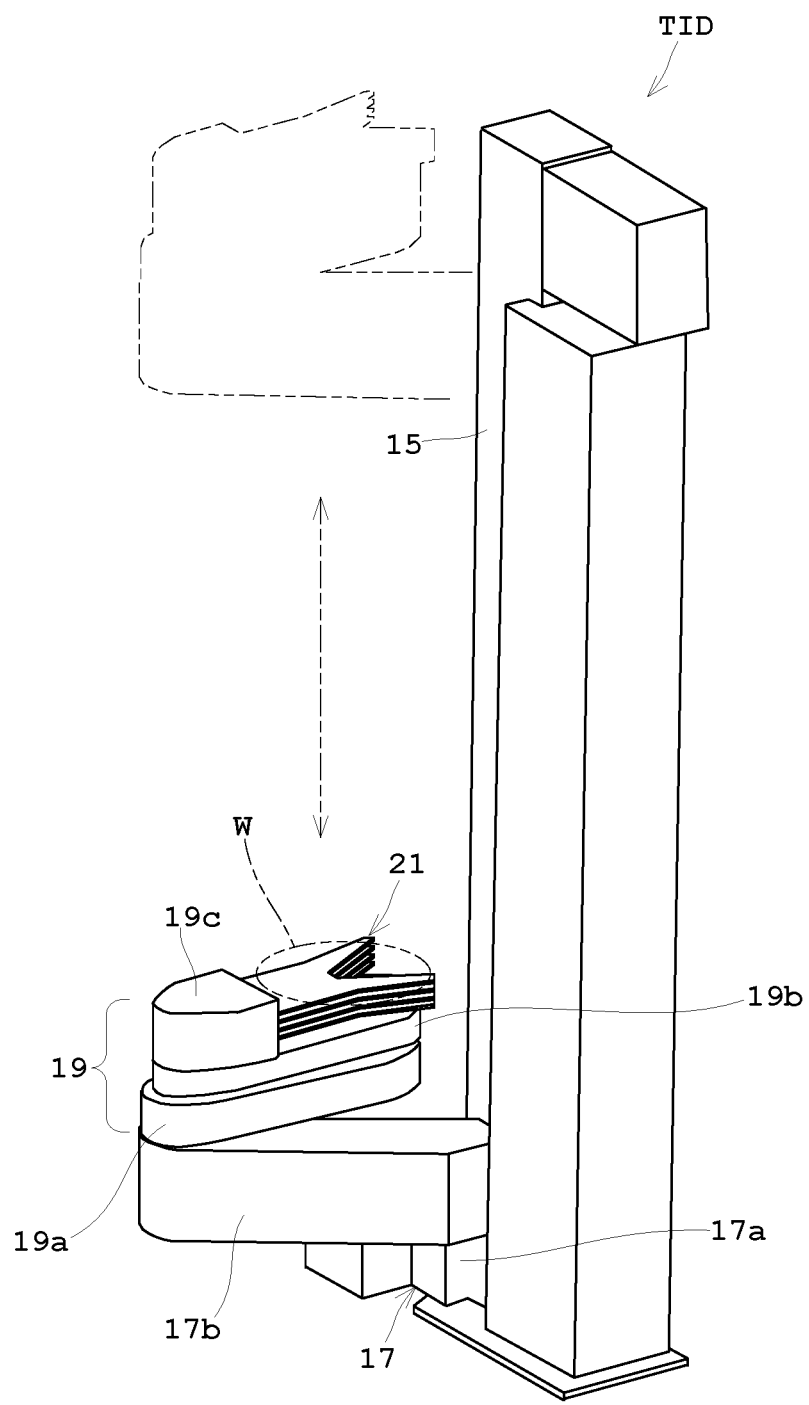
FIG. 5 is an overall perspective view of an indexer robot.

Reference is now made to FIG. 5. FIG. 5 is an overall perspective view of the indexer robot.

As shown in FIG. 5, the indexer robot TID includes a guide rail 15, a base 17, an articulated arm 19, an a hand 21. The guide rail 15 is disposed longitudinally in the up-down direction Z. A driving unit, not shown, causes the base 17 to move upward and downward through the guide rail 15. At this time, the guide rail 15 guides the base 17 in the up-down direction Z. The guide rail 15 is positioned in a horizontally fixed manner in the front-back direction X and the width direction Y. Specifically, the guide rail 15 is positioned so as not to overlap a position of the substrate W in the reversing path block 5 when seen in the width direction Y adjacent to the carrier platform 13 of the indexer block 3. In addition, the guide rail 15 is disposed adjacent to an inner wall of indexer block 3 adjacent to the reversing path block 5. Here, a line connecting the center of the indexer block 3 in the width direction Y and the center of the reversing path block 5 in the width direction Y (mount positions of the substrate W in the reversing path block 5 and a reversing path unit 31 mentioned later) is defined as a virtual line VL in plan view (see FIGS. 2 and 3). The guide rail 15 and the base 17 are shifted laterally from the virtual line VL, i.e., rightward YR in this embodiment. The base 17 is spaced apart from a rear face of the indexer block 3 by a space SP toward the carrier platform 13 in plan view. The space SP has a dimension sufficient to allow at least partial accommodation of the reversing path block 5.

In the indexer robot TID according to this embodiment, the guide rail 15 is disposed adjacent to the inner wall of indexer block 3 adjacent to the reversing path block 5. Accordingly, a distance between a carrier platform 13 in the indexer block 3 and the reversing path block 5 can be shortened, contributing a reduction in size of the substrate treating apparatus 1.

The base 17 includes a base body 17a and a fixing arm 17b. The base body 17a is disposed on the guide rail 15 in a movable manner. The fixing arm 17b protrudes laterally from the base body 17a. The fixing arm 17b protrudes in a forward direction XF from the base body 17a in such a manner that its distal end is positioned at the center of the four carrier platforms 13 in the width direction Y. That is, the fixing arm 17b protrudes in the forward direction XF from the base body 17a in such a manner that its distal end is positioned on the virtual line VL. The articulated arm 19 is formed with a first arm 19a, a second arm 19b, and a third arm 19c. Here, it is assumed that the third arm 19c where the hand 21 is disposed is on a distal end side, and the first arm 19a is on a proximal end side. A proximal end of the first arm 19a as the proximal end side of the articulated arm 19 is attached to a proximal end side of the fixing arm 17b.

The articulated arm 19 is configured in such a manner that the first to third arms 19a, 19b, and 19c are rotatable around a rotary shaft P1, a rotary shaft P2, a rotary shaft P3, respectively, along an axis in the up-down direction Z. The rotary shaft P1 is a rotary shaft of the first arm 19a on the proximal end side. The rotary shaft P2 is a rotary shaft of the second arm 19b on the proximal end side. The rotary shaft P3 is a rotary shaft of the third arm 19b on the proximal end side. The articulated arm 19 is configured in such a manner that the hand 21 is movable freely in the front-back direction X and the width direction Y. The base 17 moves upward/downward along the guide rail 15. The hand 21 moves upward/downward along the guide rail 15 together with the base 17. As described above, the hand 21 is movable in the up-down direction. Moreover, the articulated arm 19 is disposed in such a manner that the rotary shaft P1 of the first arm 19a on the proximal end side is shifted toward the reversing path block 5 (mount positions of the substrate W in the reversing path block 5 and the reversing path unit 31 mentioned later) than the guide rail 15 in the width direction Y when seen from the carrier platforms 13. That is, the rotary shaft P1 is positioned on the virtual line VL. Moreover, the rotary shaft P1 is positioned leftward YL with respect to the base 17. The indexer robot TID is configured in such a manner as above and is accessible to the four carriers C and the reversing path block 5, mentioned later, with the articulated arm 19.

Here, the rotary shaft P1 described above corresponds to the "rotary shaft in the first joint" in the present invention.

Figure 6A:
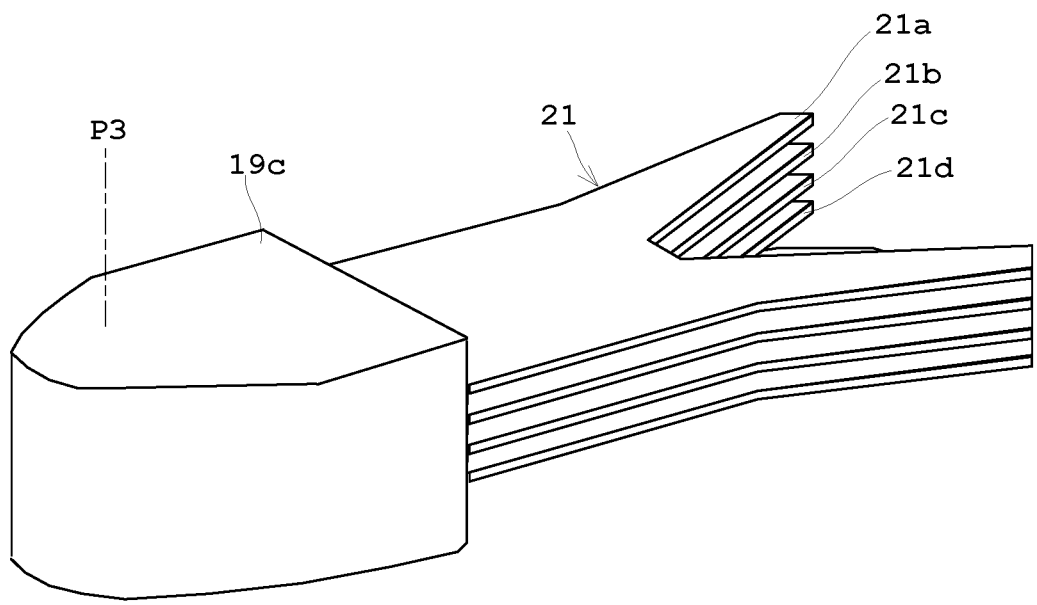
FIGS. 6A and 6B are perspective views of a hand of the indexer robot.
Figure 6B:
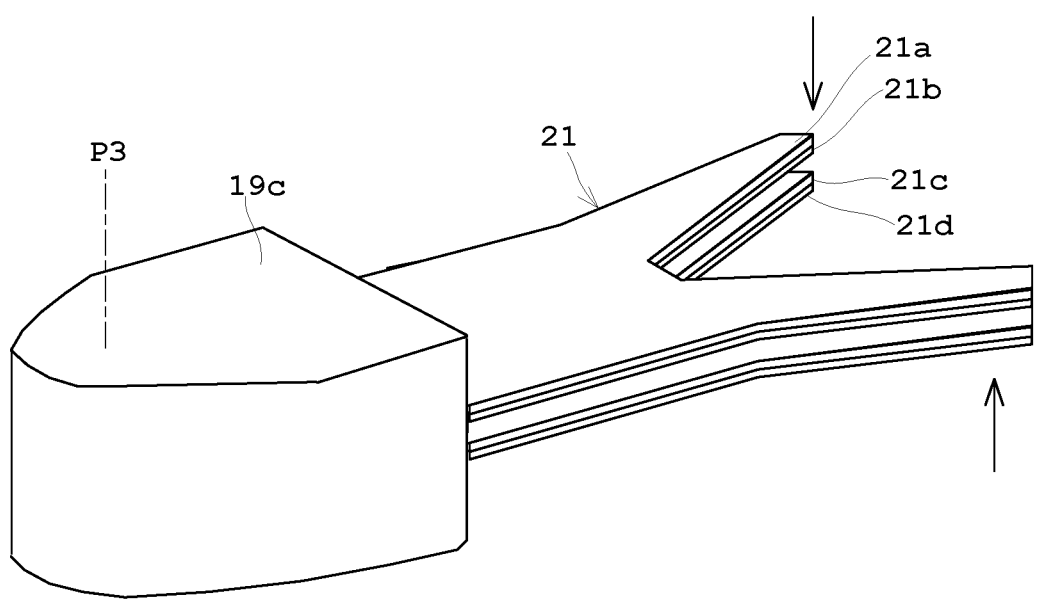

Reference is now made to FIGS. 6A and 6B. FIGS. 6A and 6B are perspective views of the hand of the indexer robot. FIG. 6A illustrates four hand bodies. FIG. 6B illustrates two hand bodies.

The indexer robot TID described above includes the hand 21. As illustrated in FIG. 6A, the hand 21 includes a hand body 21a, a hand body 21b, a hand body 21c, and a hand body 21d in this order from above to below. The four hand bodies 21a to 21d of the hand 21 are attached to the third arm 19c. Among the four hand bodies 21a to 21d, the uppermost hand body 21a and the lowermost hand body 21d are movable in the up-down direction Z as illustrated in FIG. 6B. When substrates W are transported to and from a carrier C and when the carrier C accommodates 25 substrates W, for example, the indexer robot TID transports four substrates W at a time with the four hand bodies 21a to 21d. When one substrate W is left in the carrier C, the one substrate W is transported with an integrated hand body 21a and 21b formed by integrating the hand body 21a and the hand body 21b. Then, one substrate W accommodated in the next carrier C is transported with an integrated hand body 21c and 21d formed by integrating the hand body 21c and the hand body 21d. Accordingly, the indexer robot TID having the four hand bodies 21*a* to 21*d* achieves efficient transportation to and from the carriers C each accommodating 25 substrates W.

Figure 8:
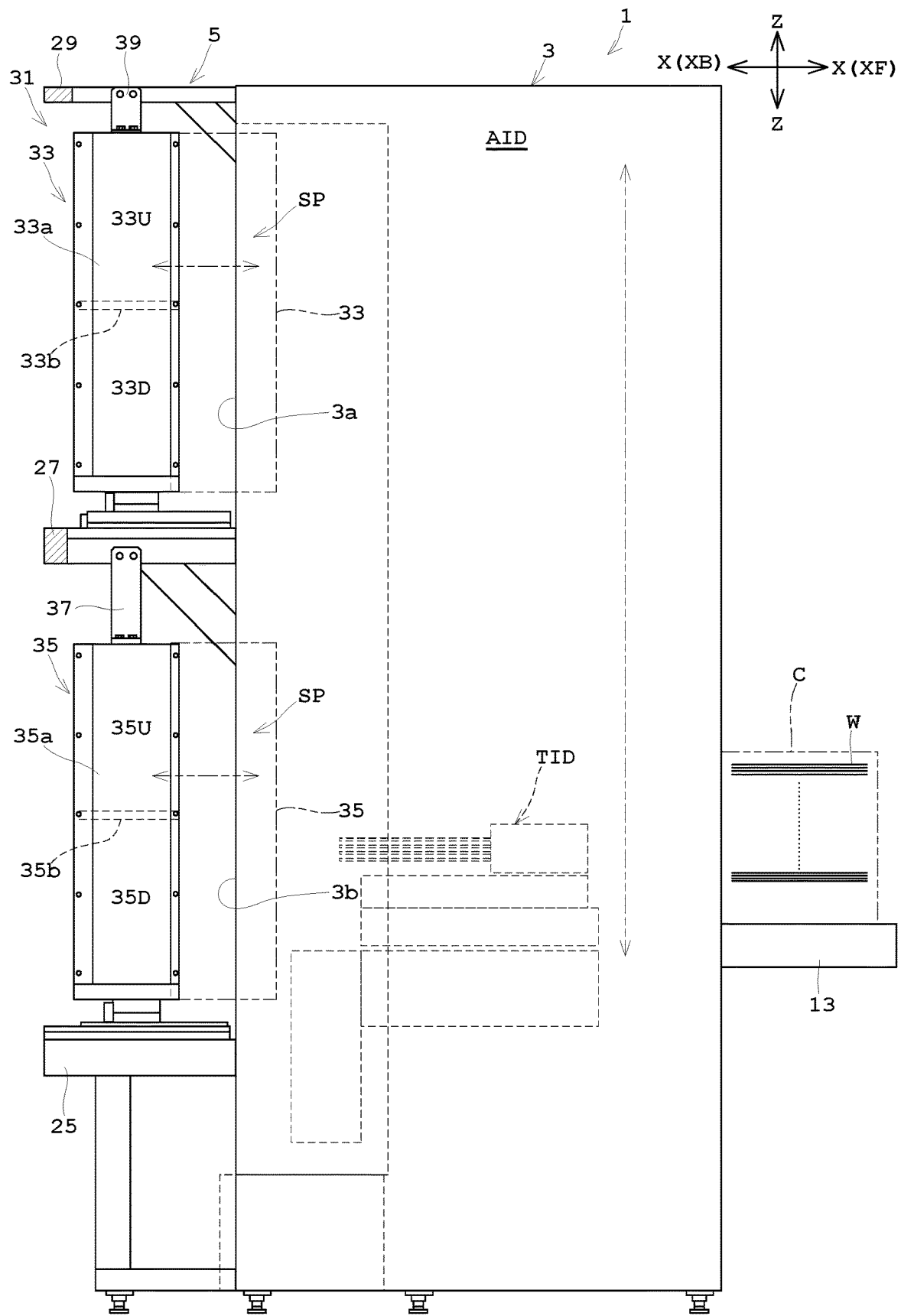
FIG. 8 illustrates the indexer block and the reversing path block seen from a left side thereof.

Reference is now made to FIGS. 7 and 8. FIG. 7 is a perspective view of a reversing path block when the indexer block is seen from a rear face thereof. FIG. 8 illustrates the indexer block and the reversing path block seen from a left side thereof.

The reversing path block 5 is attached integrally to the indexer block 3 adjacent to the treating block 7 of the indexer block 3. Specifically, the indexer block 3 includes a mount frame 25, a mount suspending frame 27, and a suspending frame 29 on its rear face side (backward XB thereof). These frames protrude from the indexer block 3 toward the treating block 7. The reversing path block 5 includes a reversing path unit 31. An upper access opening 3*a* and a lower access opening 3*b* in communication with the transportation space AID are formed on the rear face of the indexer block 3. The reversing path unit 31 includes an upper reversing path unit 33 and a lower reversing path unit 35. The upper reversing path unit 33 is positioned in correspondence to the upper access opening 3*a*, and the lower reversing path unit 35 is positioned in correspondence to the lower access opening 3*b*. A lower portion of the lower reversing path unit 35 is screwed on the mount frame 25. An upper portion of the lower reversing path unit 35 is fixed to the mount suspending frame 27 with a fixing member 37. Moreover, a lower portion of the upper reversing path unit 33 is screwed on the mount suspending frame 27. An upper portion of the upper reversing path unit 33 is fixed to the suspending frame 29 with a fixing member 39.

The upper reversing path unit 31 and the lower reversing path unit 33 are disposed so as to overlap each other without shifting each other in the front-back direction X and the width direction Y in plan view. Accordingly, this achieves a small footprint of the substrate treating apparatus 1.

The reversing path block 5 is configured integrally with the indexer block 3. When the substrate treating apparatus 1 is conveyed, at least a part of the reversing path block 5 can be accommodated inside of the indexer block 3.

Specifically, screws used for fixing the lower portions of the upper reversing path unit 33 and the lower reversing path unit 35 are firstly undone. Then, the fixing members 37, and 39 are removed. Moreover, the upper reversing path unit 33 is pushed into the space SP inside of the indexer block 3 from the upper access opening 3*a*. Finally, the lower reversing path unit 35 is pushed into the space SP inside of the indexer block 3 from the lower access opening 3*b*. Accordingly, at least a part of the reversing path block 5 is reliably accommodatable inside of the indexer block 3.

The upper reversing path unit 33 includes a reversing path casing 33*a* and a casing partition 33*b*. An upper reversing path portion 33U is disposed in an upper part of the upper reversing path unit 33, the upper part being divided by the casing partition 33*b*. A lower reversing path portion 33D is disposed in a lower part of the upper reversing path unit 33, the lower part being divided by the casing partition 33*b*. Moreover, the lower reversing path unit 35 includes a reversing path casing 35*a* and a casing partition 35*b*. An upper reversing path portion 35U is disposed in an upper part of the lower reversing path unit 35, the upper part being divided by the casing partition 35*b*. A lower reversing path portion 35D is disposed in a lower part of the lower reversing path unit 35, the lower part being divided by the casing partition 33*b*.

The following describes the reversing path unit 31 in detail with reference to FIGS. 9 and 10. FIG. 9 is a perspective view of a principal part of the reversing path unit. FIGS. 10A to 10D are operational views of the reversing path unit.

The reversing path unit 31 includes the upper reversing path unit 33 and the lower reversing path unit 35. The upper reversing path unit 33 and the lower reversing path unit 35 include the upper reversing path portions 33U, 35U and the lower reversing path portions 33D, 35D, respectively. The following describes the upper reversing path portion 33U as one example. It should be noted that the same configuration is applied to the upper reversing path portion 35U, and the lower reversing path portions 33D and 35D.

The upper reversing path portion 33U includes a guide portion 41 and a spin holder 43. The guide portion 41 places substrates W thereon. The spin holder 43 rotates so as to reverse a face of the substrate W placed on the guide portion 41. Here, a similar guide portion 41 faces a similar spin holder 43 on a rightward RY side, which is not shown for convenience of illustration. The guide portion 41 includes a plurality of (e.g., ten stages in total of five stages plus five stages) shelves 45 that are spaced apart in the front-back direction X. The shelves 45 holds a plurality of substrates W in a horizontal posture in a stacked manner. The guide portion 41 is driven by a driving unit (not shown) between a mount position (not shown) protruding rightward YR and a retracting position retreated leftward YL as shown in FIG. 9. The retracting position corresponds to a diagonally downward direction downward with respect to a leftward YL direction from the back face of the substrate W. This prevents slide of the guide portion 41 to the back face of the substrate W while the guide portion 41 retreats. Here, the guide portion 41, not shown, is driven between a mount position protruding leftward YL and a retracting position retreated diagonally downward with respect to the rightward YR direction.

The spin holder 43 is disposed between the guide portions 41. The spin holder 43 includes shelves 47 whose number is equal to those of the guide portions 41 (ten stages in total). The shelves 47 are positioned in the up-down direction Z in the same level as the shelves 45 of the guide portions 41 when the guide portions 41 are located in the mount position. The shelves 47 each include a gripper (not shown) for slightly gripping both faces of the substrate W. This achieves prevention of the substrates W from dropping off the shelves 47. The spin holder 43 is attached to a rotating member 49. The spin holder 43 includes shelves 47. The shelves 47 are separated into two parts that are apart from each other in the front-back direction X. In this embodiment, the rotating member 49 has a shape of the alphabet H. The shelves 47 are disposed at I-shaped parts at both ends of the H-shaped rotating member 49. The rotating member 49 is connected to a rotation driving unit and an advancing/retreating unit, both of which are not shown. The rotating member 49 rotates around a rotary axis P4 along the width direction Y. Moreover, the rotating member 49 advances and retreats between a grip position protruding rightward YR shown in FIG. 9 and a retracting position (not shown) retreated leftward YL. Such operation as above causes the shelves 47 to rotate or advance and retreat. Here, the rotating member 49, not shown, advances and retreats between the grip position protruding leftward YL and the retracting position retreated rightward YR.

Figure 10A:
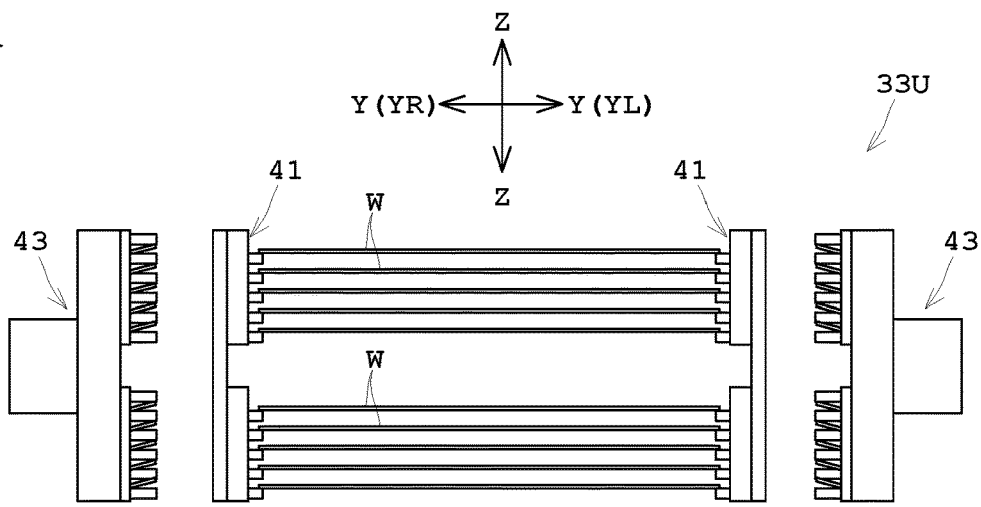
FIGS. 10A to 10D are operational views of the reversing path unit.

The upper reversing path portion 33U described above places thereon a plurality of substrates W without reversing the faces of the substrates W, and delivers the substrates W kept in a state as shown in FIG. 10A. Moreover, with such operation as shown in FIG. 10A to 10D, the faces of the substrates W are reversed and then delivered.

When the faces of the substrates W are reversed, the guide portions 41 and the spin holders 43 are driven in such a manner as below, for example.

Figure 10B:
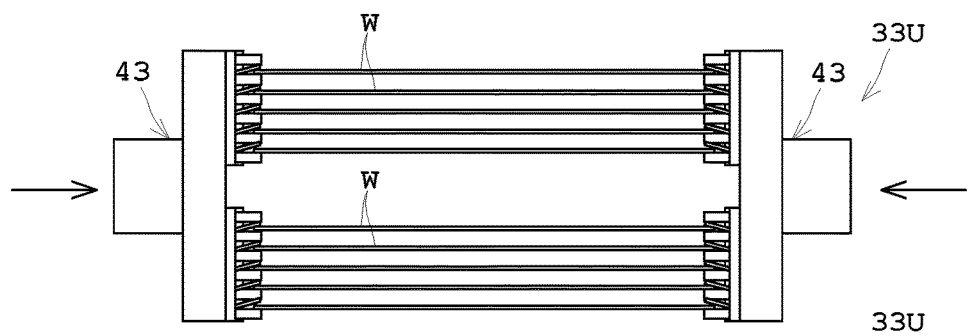
Figure 10C:
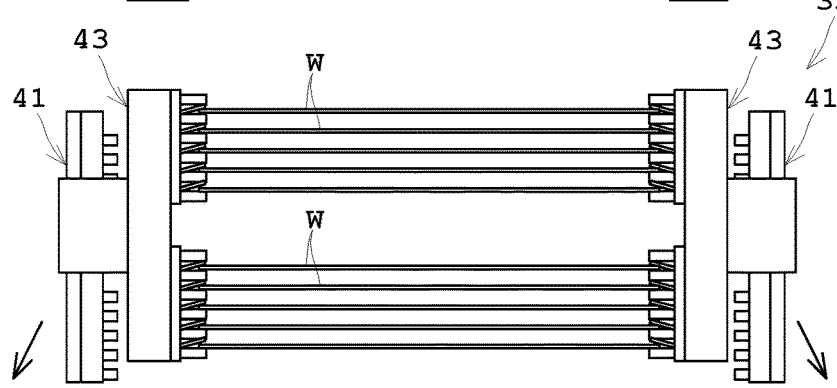
Figure 10D:
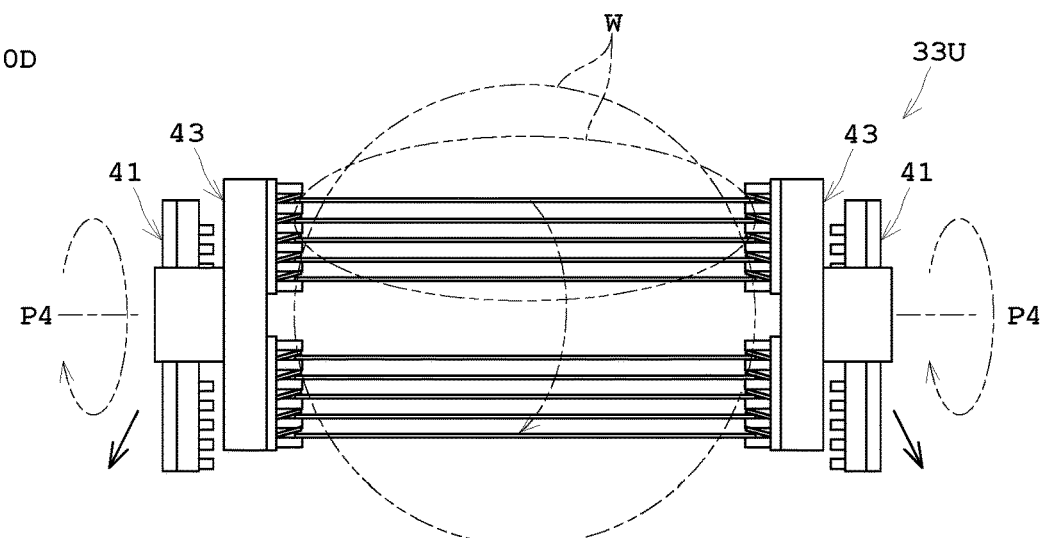

In an initial condition, the guide portions 41 are moved to the mount positions where they are spaced apart from each other in the width direction Y by a gap substantially equal to a diameter of the substrate W. The spin holders 43 are moved to the retracting positions (FIG. 10A). Under such a condition, the substrates W are placed on the guide portions 41. Then, the spin holders 43 are positioned to the grip positions (FIG. 10B). Then, the guide portions 41 are moved to the retracting positions (FIG. 10C). Moreover, the spin holders 43 rotate halfway around the rotary axis P4 (FIG. 10D). A series of such operation as above achieves reverse of the substrates W simultaneously.

Figure 11:
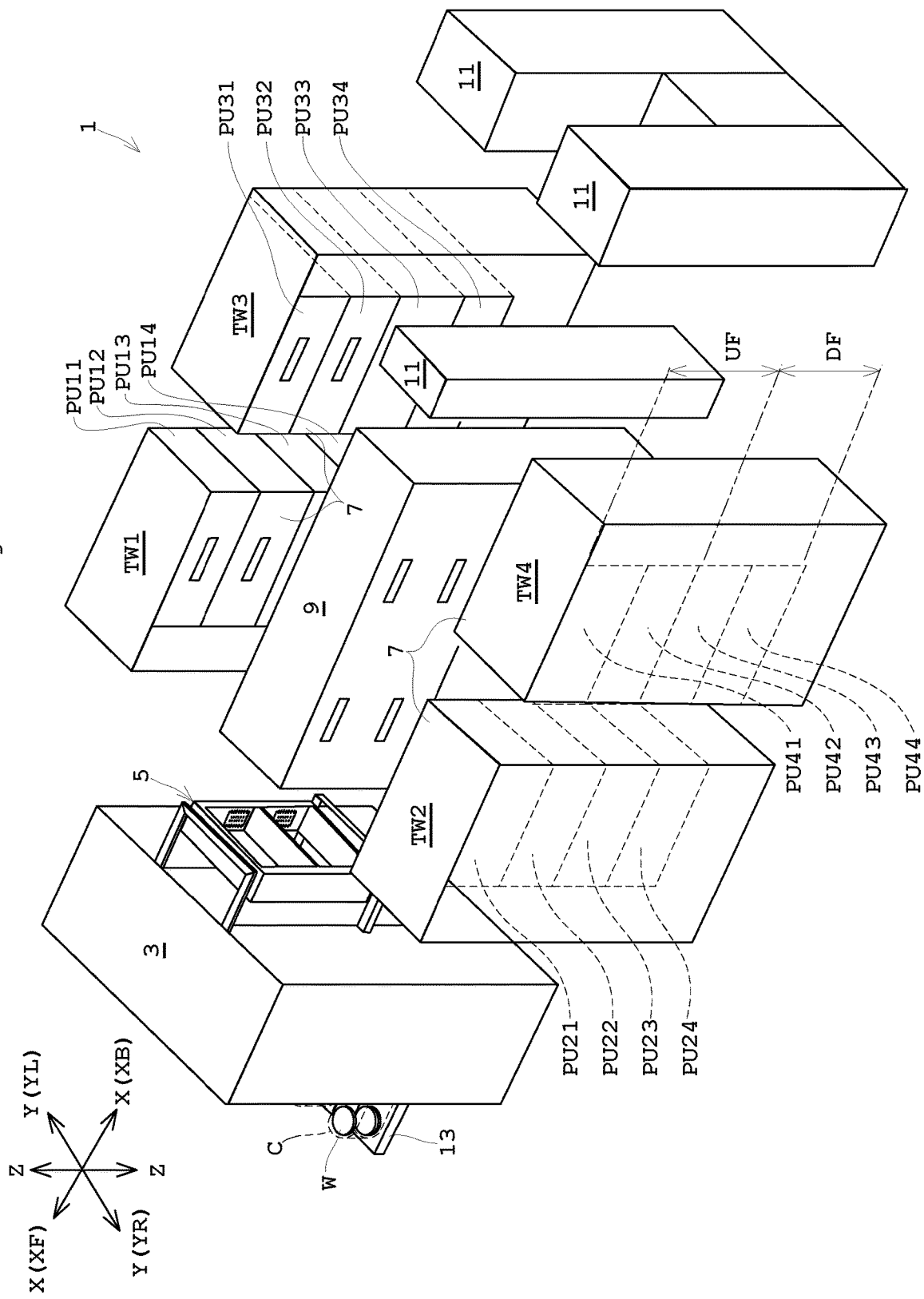
FIG. 11 is an exploded perspective view during conveyance of the substrate treating apparatus.

Reference is made again to FIGS. 2 to 4. Reference is also made to FIG. 11. FIG. 11 is an exploded perspective view during conveyance of the substrate treating apparatus.

The treating blocks 7 and the transportation block 9 are disposed backward XB of the reversing path block 5. The treating blocks 7 are disposed leftward YL and rightward YR across the transportation block 9 so as to face each other.

The treating blocks 7 each include treating units PU in each of two layers of an upper stage UF and a lower stage DF. Moreover, the treating blocks 7 each include two treating units PU in the front-back direction X. That is, one treating block 7 includes eight treating units PU. Accordingly, the two treating blocks 7 includes 16 treating units PU in total. In the following description, four treating units PU formed by an upper most treating unit PU on a leftward YL and frontward XF side to a lowermost one arranged downward are referred to as treating units PU11 to PU14, respectively, as shown in FIG. 11, when the treating units PU are needed to be distinguished. Similarly, four treating units PU formed by an upper most treating unit PU on a rightward YR and frontward XF side to a lowermost one arranged downward are referred to as treating units PU21 to PU24, respectively. Similarly, four treating units PU formed by an upper most treating unit PU on a leftward YL and backward XB side to a lowermost one arranged downward are referred to as treating units PU31 to PU34, respectively. Similarly, four treating units PU formed by an upper most treating unit PU on a rightward YR and backward XB side to a lowermost one arranged downward are referred to as treating units PU41 to PU44, respectively.

Four treating units PU11 to PU14 on the leftward YL and frontward XF side are referred to as a tower unit TW1. Four treating units PU21 to PU24 on the rightward YR and frontward XF side are referred to as a tower unit TW2. Four treating units PU31 to PU34 on the leftward YL and backward XB side are referred to as a tower unit TW3. Four treating units PU41 to PU44 on the rightward YR and backward XB side are referred to as a tower unit TW4. Here, the two treating units 7 are formed with the four tower units TW1 to TW4. On the other hand, the tower units TW1 to TW4 are controlled and handled individually, and are capable of connecting and disconnecting electric wires and flow paths individually.

As illustrated in FIG. 2, an upper layer of the upper stage UF of the treating block 7 includes front face cleaning units SS, for example. The front face cleaning unit SS cleans the front face of the substrate W. Typically, the front face of the substrate W includes electronic circuit patterns formed thereon. The front face cleaning unit SS includes, for example, a suction chuck 51, a guard 53, and a treating nozzle 55. The suction chuck 51 suction-holds around a center portion of a rear surface of the substrate W, thereby sucking the substrate W. The suction chuck 51 is rotated by an electric motor, not shown. This causes the suction chuck 51 to rotate the substrate W in a horizontal plane. The guard 53 is arranged so as to surround the side of the suction chuck 51 laterally. The guard 53 prevents scattering of a treatment liquid, supplied from the treating nozzle 55 to the substrate W, to the surrounding. The treating nozzle 55 supplies the treatment liquid to the front face of the substrate W with jet stream. This causes the treating nozzle 55 to clean the front face of the substrate W.

As illustrated in FIG. 3, a lower layer of the upper stage UF of the treating block 7 includes back face cleaning units SSR, for example. The back face cleaning unit SSR cleans a back face of the substrate W. Typically, the back face of the substrate W includes no electronic circuit patterns formed thereon. The back face cleaning unit SSR includes, for example, a mechanical chuck 57, a guard 59, and a cleaning brush 61. The mechanical chuck 57 supports against a periphery portion of the substrate W, and supports the substrate W in a horizontal posture without contacting a large part of the back face of the substrate W. The mechanical chuck 57 is rotated by an electric motor, not shown. This causes the mechanical chuck 57 to rotate the substrate W in a horizontal plane. The guard 59 is arranged so as to surround the side of the mechanical chuck 57 laterally. The guard 59 prevents scattering of a treatment liquid to the surrounding by the cleaning brush 61. The cleaning brush 61 includes a brush portion, for example, that rotates around a longitudinal axis. The cleaning brush 61 performs cleaning by applying the supplied treatment liquid to the back face of the substrate W with use of a rotation force of the brush portion.

The lower stage DF of the treating block 7 in this embodiment is configured in the same manner as that of the upper and lower layers of the upper stage UF described above. That is, an upper layer of the lower stage DF of the treating block includes front face cleaning units SS. A lower layer of the lower stage DF of the treating block includes back face cleaning units SSR. In other words, 16 treating units PU in total of the treating blocks 7 include eight front face cleaning units SS and eight back face cleaning units SSR.

Figure 12:
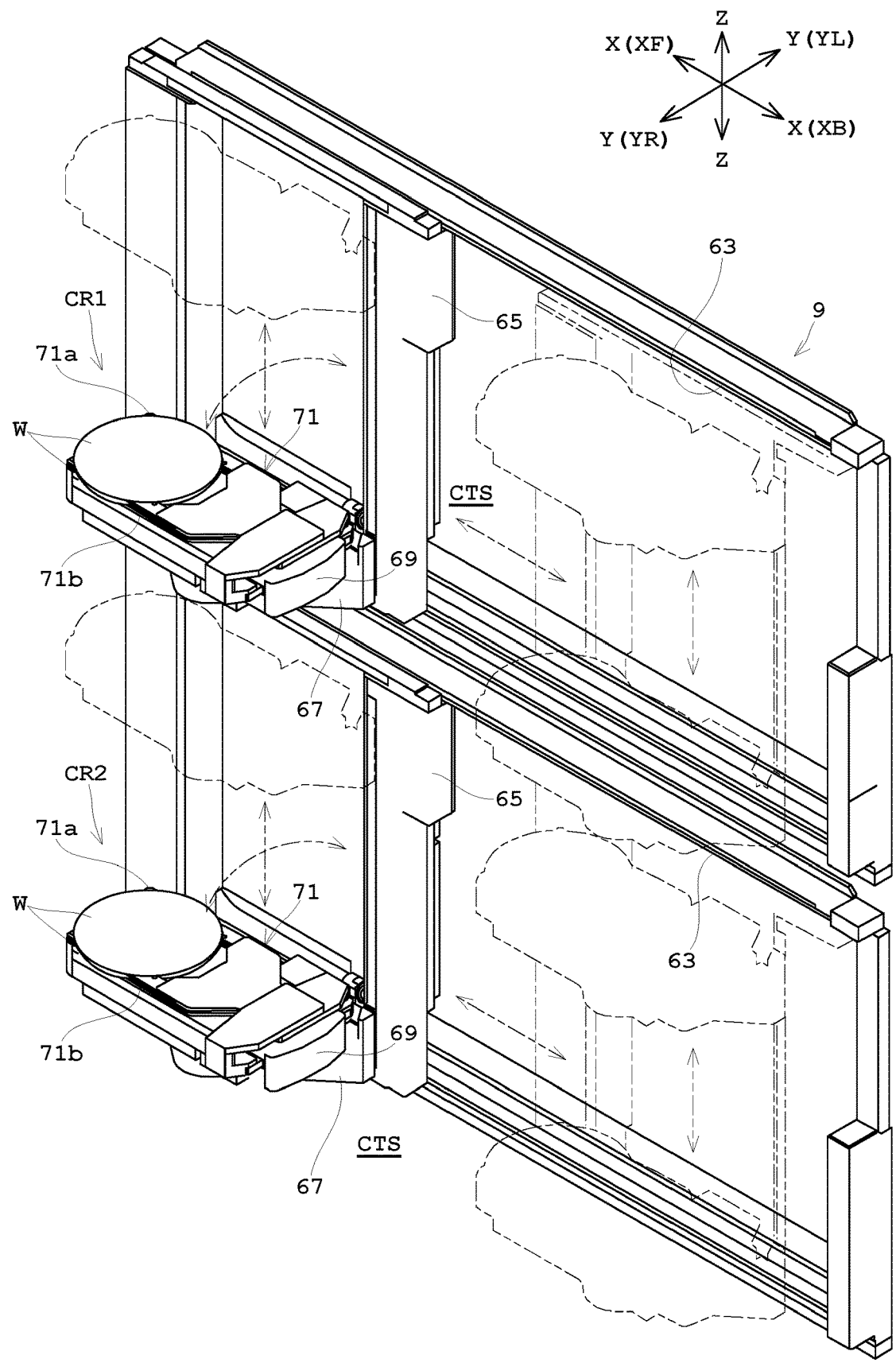
FIG. 12 is a perspective view of a principal part of a transportation block.

Reference is now made to FIG. 12 in addition to FIGS. 2 to 4. FIG. 12 is a perspective view of a principal part of a transportation block.

The transportation block 9 includes center robots CR1 and CR2 positioned so as to correspond to the upper stage UF and the lower stage DF. The transportation block 9 includes no partitions across a boundary between the upper stage UF and the lower stage DF. Accordingly, the transportation block 9 achieves down-flow from the upper stage UF to the lower stage DF within the apparatus. The center robot CR1 transports a substrate W between the upper reversing path unit 33 in the reversing path block 5 and the treating units PU in the upper stage UF. Moreover, the center robot CR2 transports the substrate W between the lower reversing path unit 35 in the reversing path block 5 and the treating units PU in the lower stage DF. As described above, the substrates W can be distributed to the treating blocks 7 in the upper stages UF and the lower stages DF with the center robots CR1 and CR2 via the upper reversing path unit 33 and the lower reversing path unit 35 in the reversing path block 5. This achieves enhanced throughput.

The center robot CR1 is configured in the same manner as the center robot CR2. Accordingly, the following description is made taking the center robot CR1 as one example.

The center robot CR1 includes a fixed frame 63, a movable frame 65, a base 67, a pivotable base 69, and an arm 71. The fixed frame 63 has an opening extending over the treating units PU in the upper stage UF. The movable frame 65 is attached in the fixed frame 63 so as to be movable in the front-back direction X. The base 67 is attached to a lower one of four frame members that form the movable frame 65. The pivotable base 69 is installed in an upper part of the base 67. The pivotable base 69 is movable with respect to the base 67 in a horizontal plane. The arm 71 is installed in an upper part of the pivotable base 69 so as to advance and retreat with respect to the pivotable base 69. The arm 71 is disposed such that an arm body 71b is stacked on the arm body 71a. The arm 71 is configured so as to advance and retreat between a first position where the arm 71 overlaps the pivotable base 69, and a second position where the arm 71 protrudes from the pivotable base 69. With such a configuration, when the center robot CR1 accesses the treating unit PU, the center robot CR1 receives a substrate W, treated in the treating unit PU, with the arm body 71a while the pivotable base 69 faces the treating unit PU. The center robot CR1 can deliver an untreated substrate W, supported by the arm body 71b, to the treating unit PU.

The transportation block 9 is configured in such a manner as described above, and there is no frame common to adjacent two treating blocks 7 in the width direction Y. Consequently, the transportation block 9 is separable from the adjacent treating blocks 7. Moreover, as shown in FIG. 11, the substrate treating apparatus 1 configured as above is separable into the indexer block 3 to which the reversing path block 5 is attached integrally, the treating blocks 7, the transportation block 9, and the utility block 11 for conveyance. Moreover, the treating blocks 7 are separable into the four tower units TW1 to TW4. Consequently, restriction in height, width and depth during conveyance by an aircraft can be resolved. Moreover, as shown in FIG. 8, the reversing path block 5 attached to the indexer block 3 integrally can be partially accommodated inside of the indexer block 3. Consequently, restriction in volume in addition to restriction in height, width and depth during conveyance by an aircraft can be resolved.

According to this embodiment, the indexer robot TID is disposed such that the guide rail 15 is positioned so as not to overlap a mount position of the substrate W in the reversing path block 5 when seen from the carrier platform 13. Accordingly, even when the base 17 is disposed adjacent to a position suitable for delivering the substrate W and facing the mount position of the substrate W, the guide rail 15 does not prevent delivering of the substrate W between the hand 21 of the indexer robot TID and the reversing path block 5. This results in enhanced deliver efficiency of the substrate W between the indexer robot TID and the reversing path block 5.

The guide rail 15 and the base 17 are shifted leftward YL from the virtual line VL connecting the center of the mount position of the substrate W and the center of the indexer block 3 in plan view. Accordingly, the guide rail 15 and the base 17 do not prevent delivering of the substrate W between the hand 21 of the indexer robot TID and the reversing path block 5.

Moreover, the fixing arm 17b includes the tip end that is disposed at the center portion in the horizontal direction along which the carrier platforms 13 are arranged. Accordingly, even when the base 17 is positioned so as not to overlap the mount position of the substrate W in the reversing path block 5, the hand 21 of the articulated arm 19 can deliver the substrate W to and from the carrier C of the carrier platform 13.

Moreover, the indexer robot TID is disposed in such a manner that the rotary shaft P1 of the articulated arm 19 is shifted from the guide rail 15 toward the mount position of the substrate W when seen from the carrier platforms 13. Accordingly, the hand 21 of the articulated arm 19 on the distal end side can easily deliver the substrate W at the mount position of the substrate W in the reversing path block 5.

The present invention is not limited to the foregoing examples, but may be modified as follows.

(1) In the embodiment described above, the guide rail 15 of the indexer robot TID is positioned so as not to overlap a mount position of the substrate W in the reversing path block 5 and to be shifted leftward YL from the virtual line VL when seen from the carrier platforms 13. However, the present invention is not limitative to this arrangement. For instance, the guide rail 15 may be shifted rightward YR from the virtual line VL. In this case, the hand 21 in a standby state is also shifted rightward YR from the guide rail 15. Moreover, the hand 21 faces the reversing path unit 31. Moreover, the fixing arm 17b extends from the leftward YL side toward the virtual line VL, and its distal end is positioned on the virtual line VL.

(2) In the embodiment described above, the indexer robot TID includes the fixing arm 17b. However, such a configuration is not essential in the present invention. Such a fixing arm 17b as above is not necessarily provided as long as the articulated arm 19 of the indexer robot TID can access to the carriers C and the reversing path unit 31 with the hand 21.

(3) In the embodiment described above, the guide rail 15 of the indexer robot TID is disposed adjacent to an inner wall of indexer block 3 adjacent to the reversing path block 5. However, such arrangement is not essential in the present invention. For instance, the guide rail 15 may be disposed apart from the inner wall of indexer block 3, adjacent to the reversing path block 5, toward the carrier platforms 13. This yields a reduction in length of the fixing arm 17b. Accordingly, the fixing arm 17b itself can be thinned, leading to a reduction in weight of the indexer robot TID itself.

(4) In the embodiment described above, the indexer robot TID includes the hand 21 formed by the four hand bodies 21a to 21d. However, the present invention is not limitative to this configuration. For instance, the hand 21 may include one or more hand bodies.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for performing a cleaning treatment on a substrate, the apparatus comprising:
 an indexer block including a carrier platform on which a carrier capable of accommodating a plurality of substrates is placed, and an indexer robot configured to transport a substrate to and from the carrier disposed on the carrier platform;
 a treating block including a cleaning unit, the cleaning unit configured to perform a cleaning treatment on a substrate; and
 a path block disposed between the indexer block and the treating block, including a plurality of shelves on which the substrates are placed, the indexer robot including a guide rail erected in a fixed manner in a horizontal direction, a base configured to move vertically along the guide rail, an articulated arm disposed on the base, and a hand configured to support a substrate on a distal arm of the articulated arm, and the guide rail is positioned so as not to overlap a mount position of the substrate in the path block when seen from the carrier platform.

2. The substrate treating apparatus according to claim 1, wherein
the guide rail is shifted laterally from a virtual line connecting the center of the mount position and the center of the indexer block in plan view.

3. The substrate treating apparatus according to claim 1, wherein
the indexer block includes a plurality of the carrier platforms in the horizontal direction,
the base includes a base body, and a fixing arm extending from the base body toward the carrier platforms,
the indexer robot further includes a proximal end of the articulated arm adjacent to a distal end of the fixing arm, and
the distal end of the fixing arm is disposed at a center portion in the horizontal direction along which the carrier platforms are arranged.

4. The substrate treating apparatus according to claim 2, wherein
the indexer block includes a plurality of the carrier platforms in the horizontal direction,
the base includes a base body, and a fixing arm extending from the base body toward the carrier platforms,
the indexer robot further includes a proximal end of the articulated arm adjacent to a distal end of the fixing arm, and
the distal end of the fixing arm is disposed at a center portion in the horizontal direction along which the carrier platforms are arranged.

5. The substrate treating apparatus according to claim 1, wherein
the guide rail is positioned adjacent to an inner wall of the indexer block adjacent to the path block.

6. The substrate treating apparatus according to claim 2, wherein
the guide rail is positioned adjacent to an inner wall of the indexer block adjacent to the path block.

7. The substrate treating apparatus according to claim 3, wherein
the guide rail is positioned adjacent to an inner wall of the indexer block adjacent to the path block.

8. The substrate treating apparatus according to claim 4, wherein
the guide rail is positioned adjacent to an inner wall of the indexer block adjacent to the path block.

9. The substrate treating apparatus according to claim 3, wherein
a rotary shaft in a first joint of the articulated arm is shifted from the guide rail toward the mount position when seen from the carrier platforms.

10. The substrate treating apparatus according to claim 4, wherein
a rotary shaft in a first joint of the articulated arm is shifted from the guide rail toward the mount position when seen from the carrier platforms.

11. The substrate treating apparatus according to claim 1, wherein
the hand includes a plurality of hand bodies configured to support a substrate.

12. The substrate treating apparatus according to claim 2, wherein
the hand includes a plurality of hand bodies configured to support a substrate.

13. The substrate treating apparatus according to claim 3, wherein
the hand includes a plurality of hand bodies configured to support a substrate.

14. The substrate treating apparatus according to claim 4, wherein
the hand includes a plurality of hand bodies configured to support a substrate.

15. The substrate treating apparatus according to claim 5, wherein
the hand includes a plurality of hand bodies configured to support a substrate.

16. The substrate treating apparatus according to claim 6, wherein
the hand includes a plurality of hand bodies configured to support a substrate.

17. The substrate treating apparatus according to claim 7, wherein
the hand includes a plurality of hand bodies configured to support a substrate.

18. The substrate treating apparatus according to claim 8, wherein
the hand includes a plurality of hand bodies configured to support a substrate.

19. The substrate treating apparatus according to claim 9, wherein
the hand includes a plurality of hand bodies configured to support a substrate.

20. The substrate treating apparatus according to claim 10, wherein
the hand includes a plurality of hand bodies configured to support a substrate.

* * * * *